United States Patent [19]

Taniguchi

[11] Patent Number: 5,719,389

[45] Date of Patent: Feb. 17, 1998

[54] COMPOSITE OPTICAL DEVICE

[75] Inventor: Tadashi Taniguchi, Kanagawa, Japan

[73] Assignee: Sony Corporation, Tokyo, Japan

[21] Appl. No.: 607,152

[22] Filed: Feb. 26, 1996

[30] Foreign Application Priority Data

Mar. 2, 1995 [JP] Japan ................................ 7-068803

[51] Int. Cl.$^6$ ................................................ H03J 3/14
[52] U.S. Cl. ........................... 250/201.5; 250/208.5; 250/216; 369/44.41
[58] Field of Search ........................ 250/201.5, 208.5, 250/214 C, 214 A, 214 AG, 214 R, 216; 369/44.41, 44.42

[56] References Cited

U.S. PATENT DOCUMENTS 5,350,917  9/1994  Taniguchi et al. ................... 250/216
5,396,061  3/1995  Taniguchi et al. ................... 250/216
5,461,224  10/1995  Asoma et al. ..................... 250/201.5

*Primary Examiner*—Edward P. Westin
*Assistant Examiner*—Kevin Pyo
*Attorney, Agent, or Firm*—Ronald P. Kananen

[57] ABSTRACT

A laser coupler comprises photodiodes formed on a photodiode IC, a microprism mounted on the photodiode IC to lie on the photodiodes, and a semiconductor laser mounted nearby on the photodiode IC such that a beam of light entering into the microprism through its incident surface is bifurcated and introduced onto the photodiodes. A difference between the amount of incident light to one of the photodiodes and the amount of incident light to the other of the photodiodes is corrected by adjusting a difference between the gain of a current-voltage converter amplifier coupled to one of the photodiodes and the gain of a current-voltage converter amplifier coupled to the other photodiode. Thus, the laser coupler can be fabricated economically.

12 Claims, 12 Drawing Sheets

COMPOSITE OPTICAL DEVICE

BACKGROUND OF THE INVENTION

1. Field of the Invention

This invention relates to a composite optical device and, in particular, is suitable for use to a so-called laser coupler.

2. Related Art

There is a composite optical device called laser coupler. FIGS. 1, 2 and 3 show a conventional laser coupler used as an optical pickup of a small CD player, for example. FIG. 1 is a perspective view of the laser coupler, FIG. 2 is a longitudinal cross-sectional view of the laser coupler, and FIG. 3 is an enlarged cross-sectional view of a microprism bonding portion in the laser coupler.

As shown in FIGS. 1 and 2, the laser coupler comprises a microprism 102 made of optical glass and a LOP (laser on photodiode) chip supporting thereon a photodiode 103 which in turn supports thereon a semiconductor laser 104, which are mounted on a photodiode integrated circuit (hereinafter called photodiode IC) 101 in a close relationship. The photodiode IC 101 includes a pair of photodiodes PD1 and PD2 for detecting an optical signal, a current-to-voltage (I-V) converter amplifier and an arithmetic processing unit (the latter two not shown) which all are incorporated into an IC formed on a silicon support body. The photodiode 103 is configured to monitor light output from a rear end surface of the semiconductor laser 104 and to control light output from a front end surface of the semiconductor laser 104.

As shown in FIG. 2, the microprism 102 has a slanted surface 102a behaving as an incident surface, top surface 102b, bottom surface 102c, end surface 102d and end surface 102e. The microprism 102 has formed a half mirror 105 on the slanted surface 102a and a total reflection film 106 on the top surface 102b. The end surface 102d nearer to the LOP chip is a polished surface, and a light absorbing film 107 is formed on the end surface 102e opposite from the LOP chip.

As shown in FIG. 3, an anti-reflection film 108 is formed on the entirety of the bottom surface 102c of the microprism 102, and a silicon dioxide (SiO$_2$) film 109 is formed on the anti-reflection film 108. On the other hand, formed on the photodiode PD1 of the photodiode IC 101 is a silicon nitride (SiN) film 110 on which is formed a SiO$_2$ film 111 as a passivation film to cover surfaces of the SiN film 110 and the photodiode PD2. The SiO$_2$ film 109 formed on the bottom surface 102c of the microprism 102 is bonded to the SiO$_2$ film 111 on the photo diode IC 101 by an adhesive 112 to mount the microprism 102 on the photodiode IC 101. In this case, the SiN film 110 on the photodiode PD1 and the upper-lying SiO$_2$ film 111 make up a half mirror. The SiO$_2$ film 109 is used to reinforce the bonding strength of the microprism 102 by the adhesive 112. The SiO$_2$ film 111 is used for passivation of the surface of the photodiode IC 101 and to reinforce the bonding strength of the microprism 102 by the adhesive 112. In FIG. 2, the SiO$_2$ film 109 and the SiN film 110 are omitted from illustration.

The photodiodes PD1 and PD2 used here are of a four-sectional type as shown in FIG. 4. In the same figure, A1 to A4 denote individual photodiodes of the sectional type photodiode PD1, and B1 to B4 denote individual photodiodes of the sectional type photodiodes PD2.

The laser coupler having the above construction, as shown in FIG. 5, is accommodated in a flat package 113 made of ceramics, for example, and sealed by a window cap (not shown).

Next explained are operations of the laser coupler with reference to FIG. 6.

As shown in FIG. 6, a laser beam L exiting from the front end surface of the semiconductor laser 104 is first reflected by the half mirror (not shown) on the slanted surface 102a of the microprism 102, and then converged by an object lens OL onto a disk D for reading signals therefrom. The laser beam L reflected by the disk D enters into the microprism 102 through the half mirror (not shown) on the slanted surface 102a of the microprism 102. One half (50%) of the beam entering into the microprism 102 enters into the photodiode PD1, and the other half (50%) of the beam is reflected by the half mirror (not shown) on the photodiode PD1 and then by the top surface 102b of the microprism 102 onto the photodiode PD2.

The laser coupler is designed so that spot sizes on the front and rear photodiodes PD1 and PD2 are equal when the laser beam L focalizes on a recording plane of the disk D; however, if the focalization deviates from the recording plane, then the spot sizes on the photodiodes PD1 and PD2 differ from each other. Then, if the deviation of focalization corresponds to a difference between an output signal from the photodiode PD1 and an output signal from the photodiode PD2, a focus error signal can be detected. The point where the focus error signal is zero corresponds to the point at which the focalized position lies on the recording plane of the disk, that is, the just focus point. By a feedback control of a focus servo system such that the focus error signal becomes zero, the just-focus state can be maintained, and the disk D can be reproduced in a good condition. In FIG. 4, the focus error signal is made of (A1+A2+B3+B4)−(A3+A4+B1+B2).

There is an improved version of the above-explained conventional laser coupler, as shown in FIG. 7, which is different therefrom in that a half mirror 114 is formed in an area of the bottom surface 102c of the microprism 102 corresponding to the photodiode PD1 via an anti-reflection film 108 and in that a SiO$_2$ film 111 formed on the entire surface of the photodiode IC 101.

In the conventional laser coupler shown in FIGS. 1, 2 and 3, the SiN film 110 formed on the photodiode PD1 to make up the half mirror together with the SiO$_2$ film 111 is made in a process for manufacturing the photodiode IC 101 by first making the SiN film on the entire surface of the photodiode IC 101 and then patterning the SiN film by etching. That is, the conventional laser coupler requires lithography and etching to selectively form the SiN film 110 only on the photodiode PD1, which increases the manufacturing cost of the photodiode IC 101.

In the case of the latter laser coupler shown in FIG. 7, the photodiode IC 101 need not have a half mirror thereon, and can be fabricated inexpensively. Instead, however, the microprism 102 needs the half mirror 114 made on a selective area of the bottom surface 102a, which increases the manufacturing cost of the microprism 102.

For the reasons explained above, it has been difficult heretofore to reduce the manufacturing cost of laser couplers.

SUMMARY OF THE INVENTION

It is therefore an object of the invention to provide a composite optical device of a low manufacturing cost.

According to the invention, there is provided a composite optical device comprising:

a support body having at least a first light detective device, a second light detective device, a first current-voltage converter amplifier coupled to an output of the first light detective device, and a second current-voltage converter amplifier coupled to an output of the second light detective device; and a light emitting device formed on the support body;

a prism formed on the support body to lie over the first light detective device and the second light detective device, in which:

a beam of light entering into the prism through a predetermined incident surface of the prism is bifurcated and introduced onto the first light detective device and the second light detective device; and a difference between the amount of incident light introduced onto the first light detective device and the amount of incident light introduced onto the second light detective device is corrected by adjusting a difference between the gain of the first current-voltage converter amplifier and the gain of the second current-voltage converter amplifier.

The difference between the gain of the first current-voltage converter amplifier and the gain of the second current-voltage converter amplifier is typically determined by adjusting the value of resistance in the first current-voltage converter amplifier and/or the value of resistance in the second current-voltage converter amplifier.

In an aspect of the invention, a half mirror is formed on the entire area of the bottom surface of the prism. The half mirror is made of, for example, a dielectric multi-layered film.

In another aspect of the invention, a half mirror is formed on the entire surface of the support body. The half mirror is made of, for example, a silicon nitride film formed on the support body and a silicon dioxide film formed on the silicon nitride film.

In a further aspect of the invention, a half mirror is made of an interface between the support body and a passivation film formed on the entire surface of the support body.

The support body is typically a semiconductor substrate which may be, for example, a silicon (Si) substrate.

The passivation film of the support body is, for example, a silicon dioxide ($SiO_2$) film.

The first light detective device and the second light detective device are typically of a multi-sectional type and, more specifically, of a four-sectional type.

In a typical aspect of the invention, the composite optical device is a laser coupler.

A composite optical device according to one or another aspect of the invention, in which a difference between the amount of incident light to the first light detective device and the amount of incident light to the second light detective device is corrected by a difference between the gain of the first current-voltage converter amplifier and the gain of the second current-voltage converter amplifier, does not need locally forming a half mirror on a selective portion of the support body or on a selective portion of the bottom surface of the prism, but permits forming a half mirror over the entire surface of the support body or over the entire area of the bottom surface of the prism. Therefore, both the support body and the prism can be fabricated economically. It results in decreasing the manufacturing cost of composite optical devices such as laser couplers.

The above, and other, objects, features and advantages of the present invention will become readily apparent from the following detailed description thereof which is to be read in connection with the accompanying drawings.

DETAILED DESCRIPTION OF THE PREFERRED EMBODIMENTS

Figure 1:
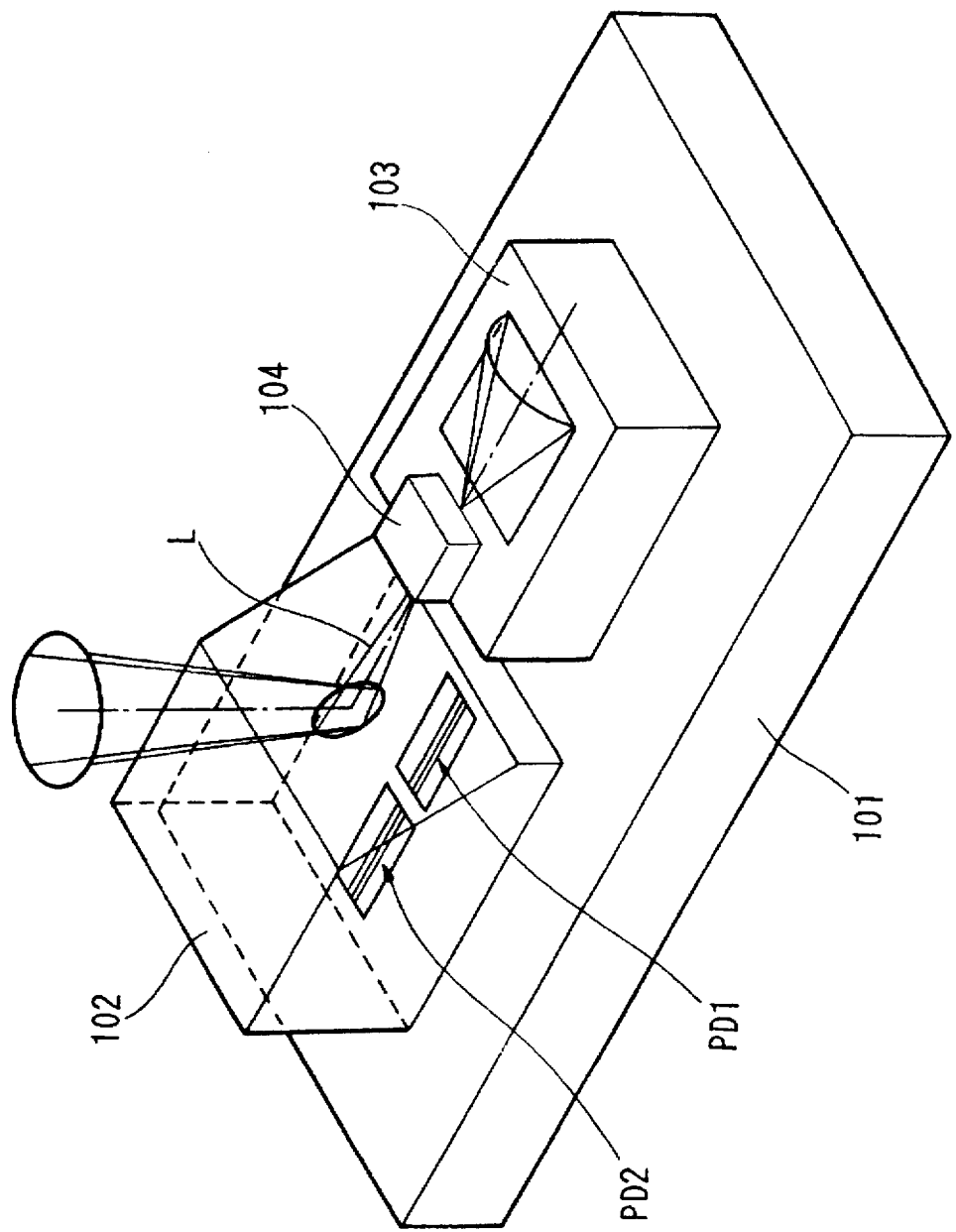
FIG. 1 is a perspective view showing a conventional laser coupler.
Figure 2:
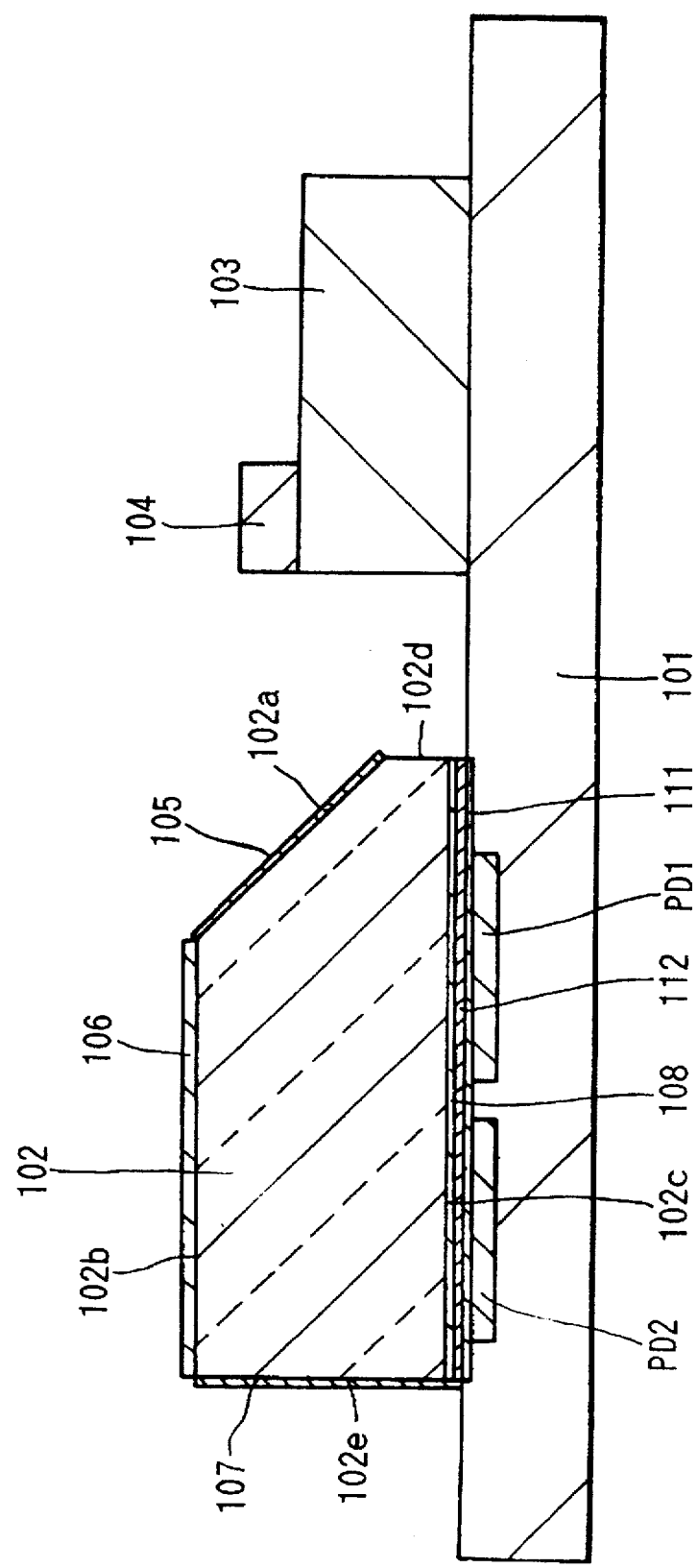
FIG. 2 is a cross-sectional view showing the conventional laser coupler.
Figure 3:
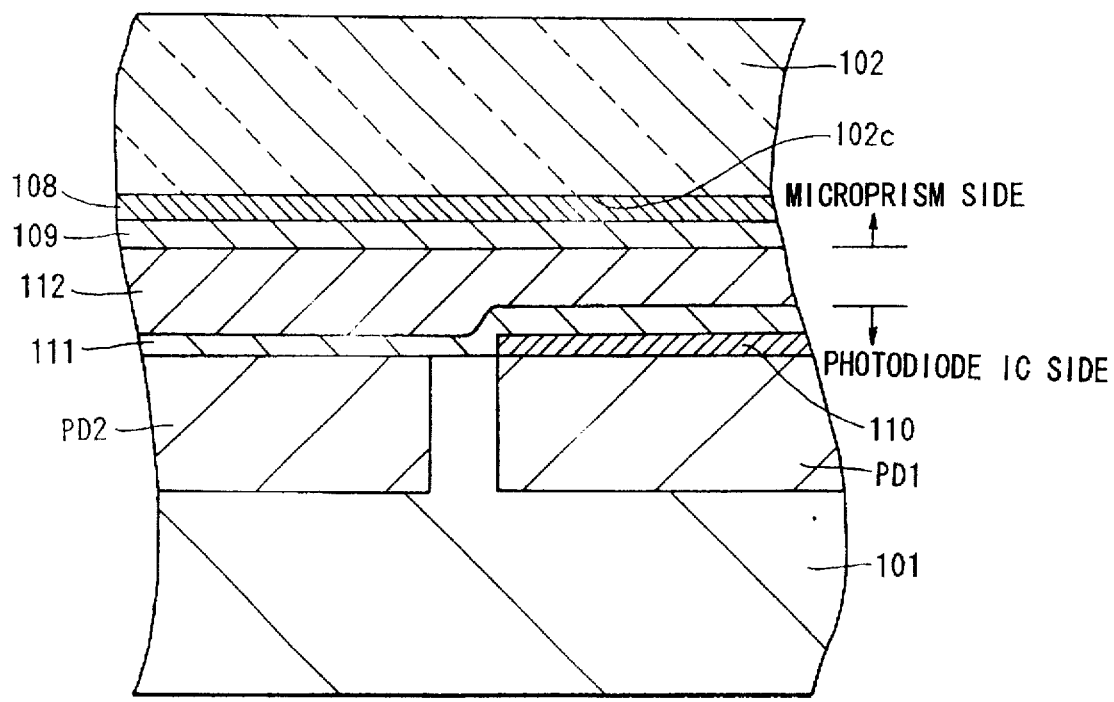
FIG. 3 is a fragmentary view of the conventional laser coupler in an enlarged scale.

Embodiments of the invention are explained below with reference to the drawings. In all figures of embodiments, common or equivalent parts or elements are labelled with the same reference numerals.

Figure 8:
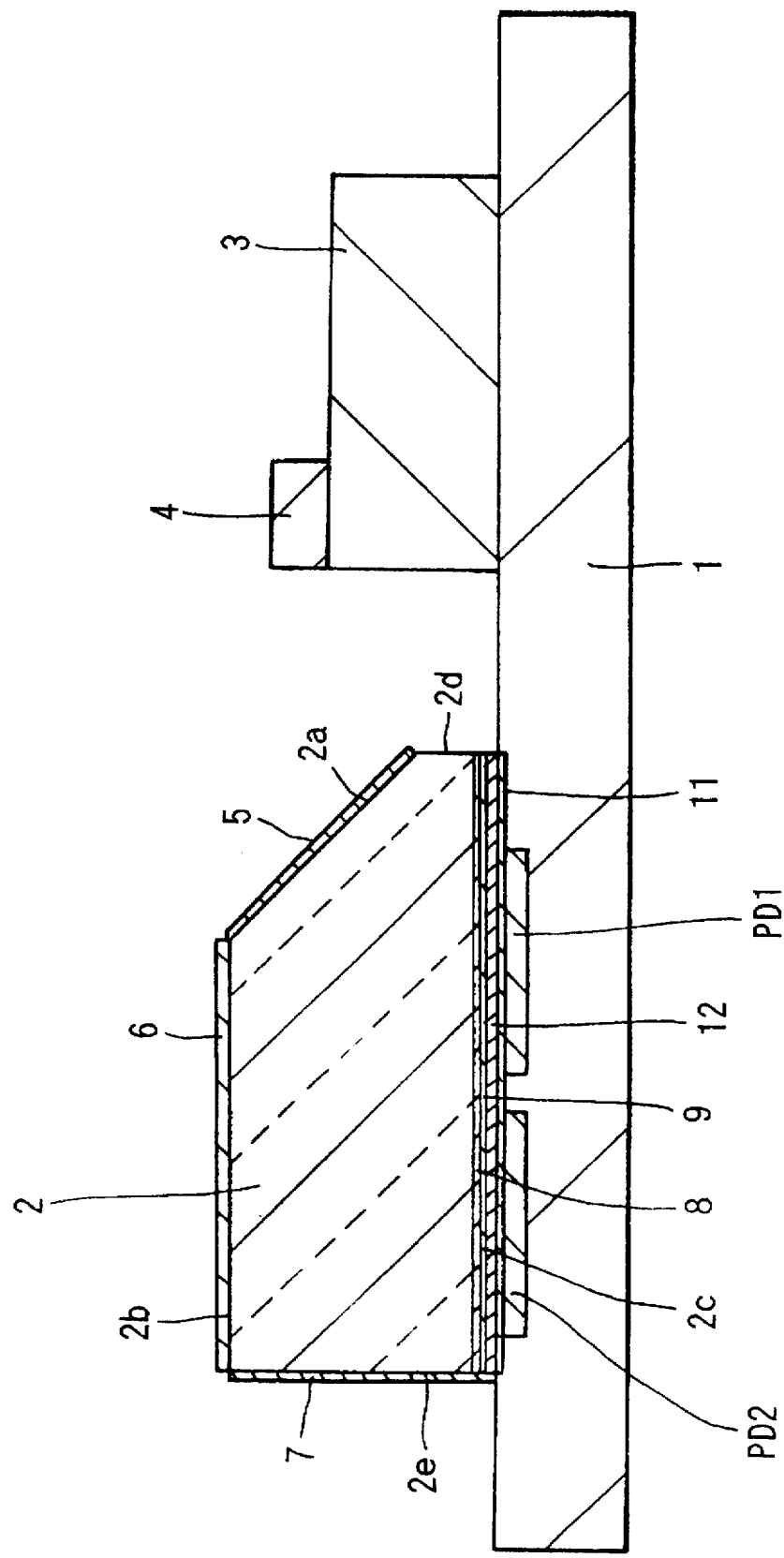
FIG. 8 is a cross-sectional view showing a laser coupler according to the first embodiment of the invention.
Figure 9:
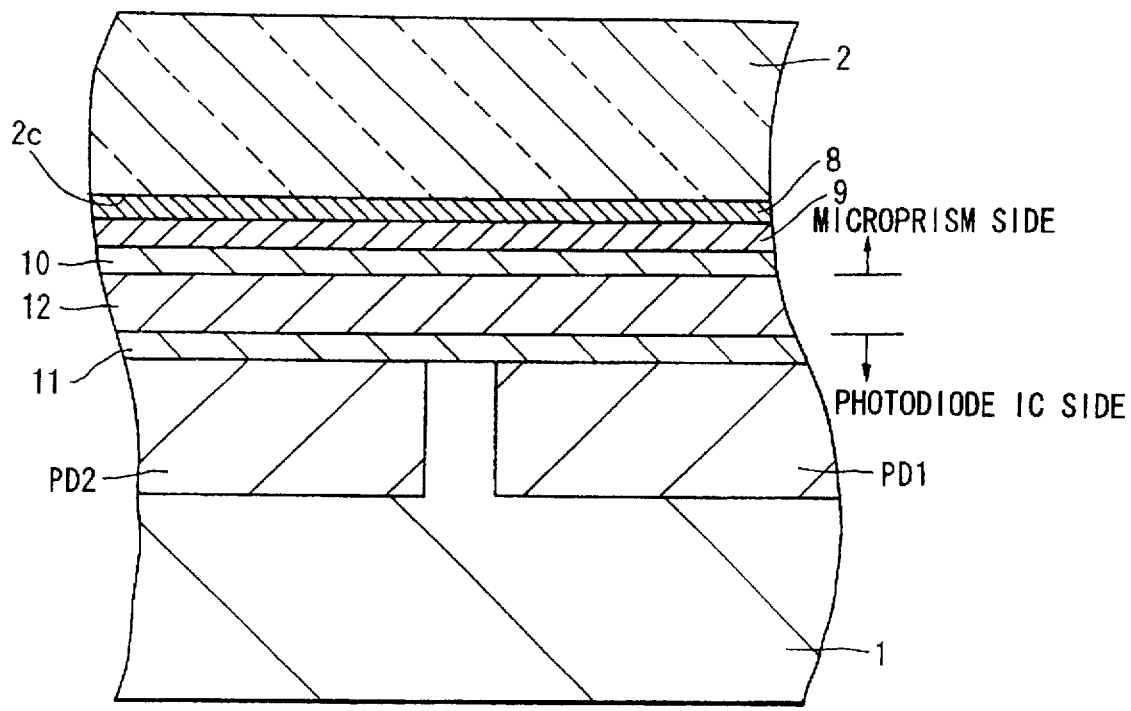
FIG. 9 is a fragmentary, enlarged, cross-sectional view of the laser coupler according to the first embodiment of the invention.

FIG. 8 is a cross-sectional view showing a laser coupler taken as the first embodiment of the invention. FIG. 9 is an enlarged, cross-sectional view of a bonding portion of a microprism in the laser coupler. The laser coupler according to the first embodiment, when viewed perspectively, appears the same as FIG. 1.

As shown in FIG. 8, the laser coupler according to the invention comprises a photodiode integrated circuit (hereinafter called photodiode IC) 1 which supports thereon in close locations a microprism 2 and an LOP chip comprising a photodiode 3 and a semiconductor laser 4 put on the photodiode 3. The microprism 2 is made of, for example, optical glass (with the refractive index of 1.766, for example). The photodiode IC 1 includes a pair of photodiodes PD1 and PD2 for detecting optical signals, current-to-voltage (I-V) converter amplifiers of these photodiodes PD1 and PD2 and an arithmetic processing unit (none of them shown) which all are incorporated into an IC (for example, a bipolar IC) typically formed on a silicon support body. The photodiode IC 1 will be explained later in greater detail. The photodiode 3 is used to monitor light output from a rear end surface of the semiconductor laser 4 and to control light output from a front end surface of the semiconductor laser 4. The photodiode 3 is a Si chip, for example, and the semiconductor laser 4 may be, for example, a GaAs/AlGaAs semiconductor laser (having the oscillation wavelength of 780 nm, for example).

As shown in FIG. 8, the microprism 2 has a slanted surface 2a used as an incident surface, top surface 2b, bottom surface 2c, end surface 2d and end surface 2e. The microprism 2 has formed a half mirror 5 on the slanted surface 2a, a total reflection film 6 on the top surface 2b, a polished surface along the end surface 2d nearer to the LOP chip, and a light absorbing film 7 on the end surface 2e opposite from the LOP chip. Used as the half mirror 5 is, for example, a dielectric multi-layered film having the reflectance of 20%, for example. Used as the total reflection film 6 is a dielectric multi-layered film, for example. These dielectric multi-layered films may be made of ZrO, TiO, SiO$_2$, and so on. The microprism 2 may be sized, for example, 0.6 mm in height, 1.52 mm in total length, 1.8 mm in width, and 1.1 mm in length of the top surface 2b.

As shown in FIG. 9, an anti-reflection film 8 is formed on the entire area of the bottom surface 2c of the microprism 2. Formed on the anti-reflection film 8 are a half mirror 9 and a SiO$_2$ film 10. The photodiode IC 1 has formed on its entire surface a SiO$_2$ film 11 as a passivation film. The microprism 2 is mounted on the photodiode IC 1 by bonding the SiO$_2$ film 10 of the bottom surface 2c of the microprism 2 onto the SiO$_2$ film 11 of the photodiode IC 1 by an adhesive 12. Used as the anti-reflection film 8 is, for example, a CeF$_3$ film or an Al$_2$O$_3$ of a thickness around 150 nm and the reflectance of 1.61, for example. The half mirror 9 is made of a dielectric multi-layered film of ZrO, TiO, SiO$_2$, and so forth of a thickness around 600 nm. The SiO$_2$ film 10 is used to reinforce the bonding strength of the microprism 2, and has a thickness around 150 nm. The SiO$_2$ film 11 is used for passivation of the surface of the photodiode IC 1 and to reinforce the bonding strength of the microprism 2 by the adhesive 12, and its thickness is about 500 nm. Used as the adhesive 12 is, for example, a silicone resin adhesive (having the reflectance of 1.43, for example) which cures with ultraviolet rays. The thickness of the adhesive 12 is typically 10 μm. The SiO$_2$ film 10 is omitted from illustration in FIG. 8.

Figure 4:
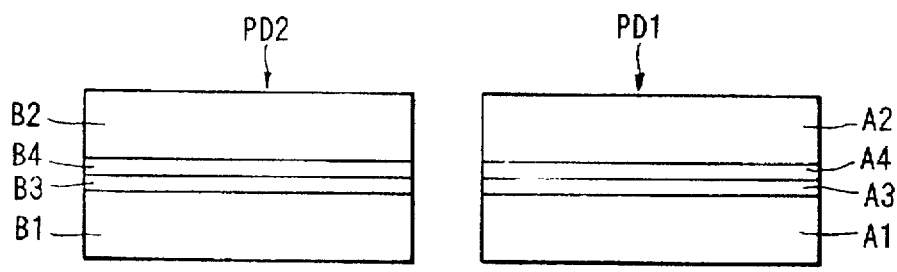
FIG. 4 is a plan view showing the pattern of a photodiode in a photodiode IC of the conventional laser coupler.

The photodiodes PD1 and PD2 used here are of the same four-sectional type as that shown in FIG. 4.

Figure 5:
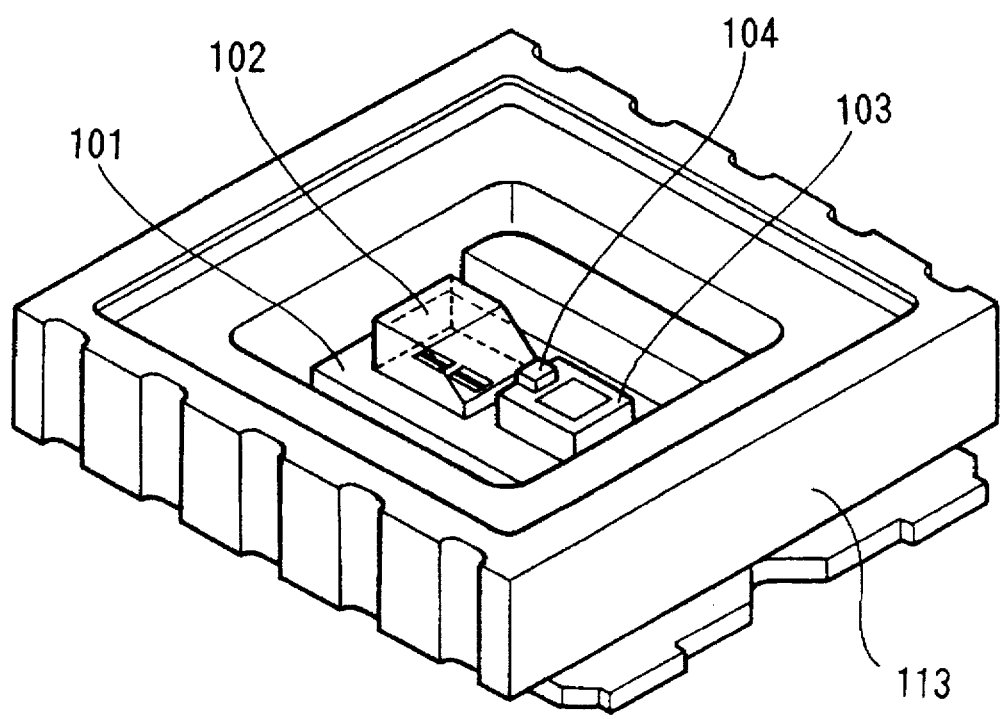
FIG. 5 is a perspective view of the conventional laser coupler packaged in a flat package.
Figure 6:
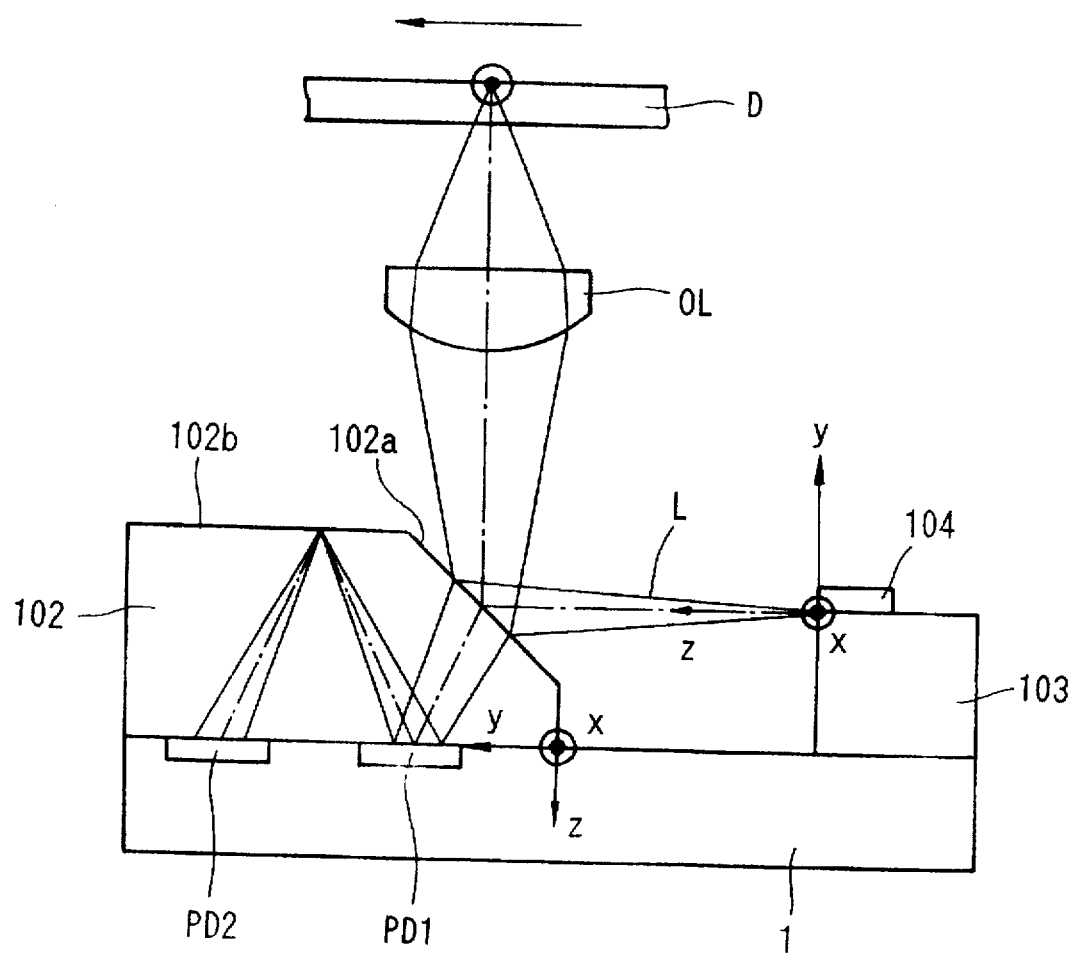
FIG. 6 is a schematic view for explaining operations of a laser coupler used as an optical pickup of a CD player.
Figure 7:
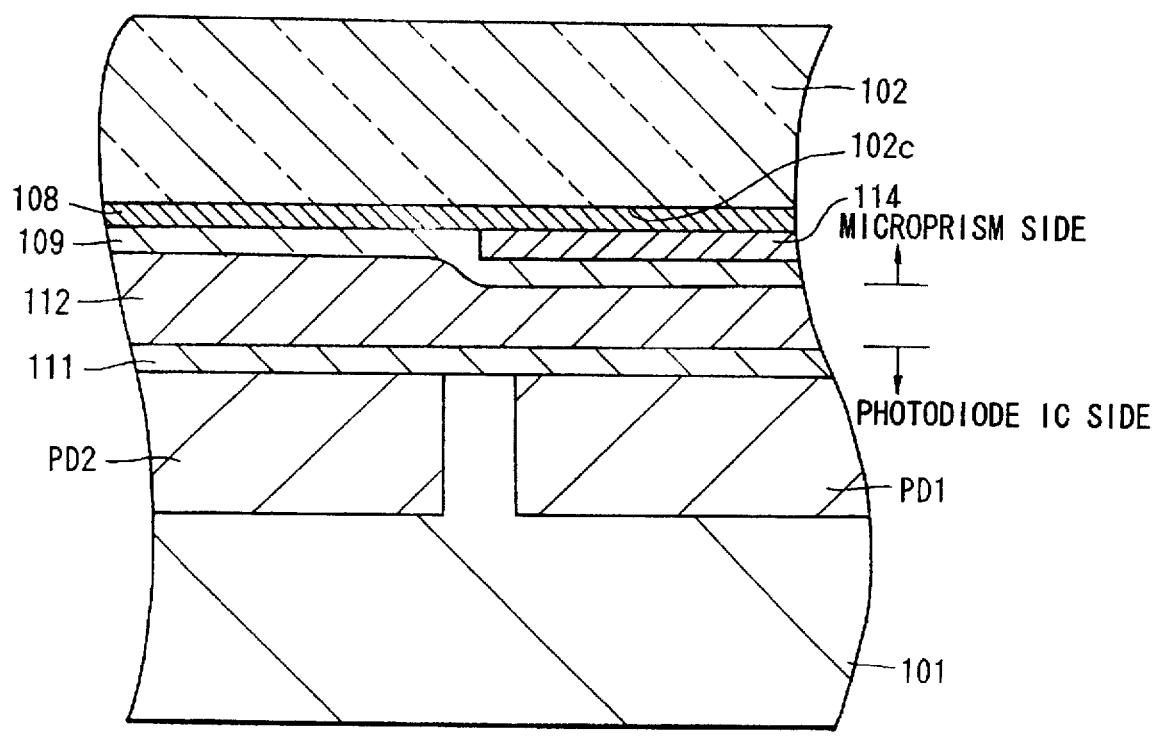
FIG. 7 is a fragmentary, enlarged, cross-sectional view of another conventional laser coupler.

The laser coupler having the above construction is accommodated in a flat package 113 made of ceramics, for example, and sealed by a window cap (not shown), in the same manner as explained with reference to FIG. 5.

As explained above, the laser coupler according to the first embodiment includes the half mirror 9 formed on the entire area of the bottom surface 2c of the microprism 2. Therefore, the amount of incident light to the photodiode PD2 is less than the amount of incident light to the photodiode PD1. That is, $$P_F = P_0 \times (1-R)$$

$$P_R = P_0 \times R \times (1-R)$$

where $P_F$ is the intensity of incident light to the photodiode PD1, $P_R$ is the intensity of incident light to the photodiode PD2, $P_0$ is the intensity of incident light entering into the microprism 2 through the slanted surface 2a, and R is the reflectance of the half mirror 9. Since 0<R<1, then $P_R < P_F$.

As a result, $P_R:P_F = 1:R$. When R=0.5, for example, then $P_R:P_F = 1:0.5 = 2:1$.

If gains of I-V converter amplifiers for converting output current signals of the photodiodes PD1 and PD2 into voltages are determined so that (gain of the I-V converter amplifier of the photodiode PD1):(gain of the I-V converter amplifier of the photodiode PD2)=R:1, then it can equivalently be attained that (output signal from the photodiode PD1):(output signal from the photodiode PD2)=1:1.

Taking it into consideration, the first embodiment is configured as follows in order to realize the relation, (gain of the I-V converter amplifier of the photodiode PD1):(gain of the I-V converter amplifier of the photodiode PD2)=R:1.

Figure 10:
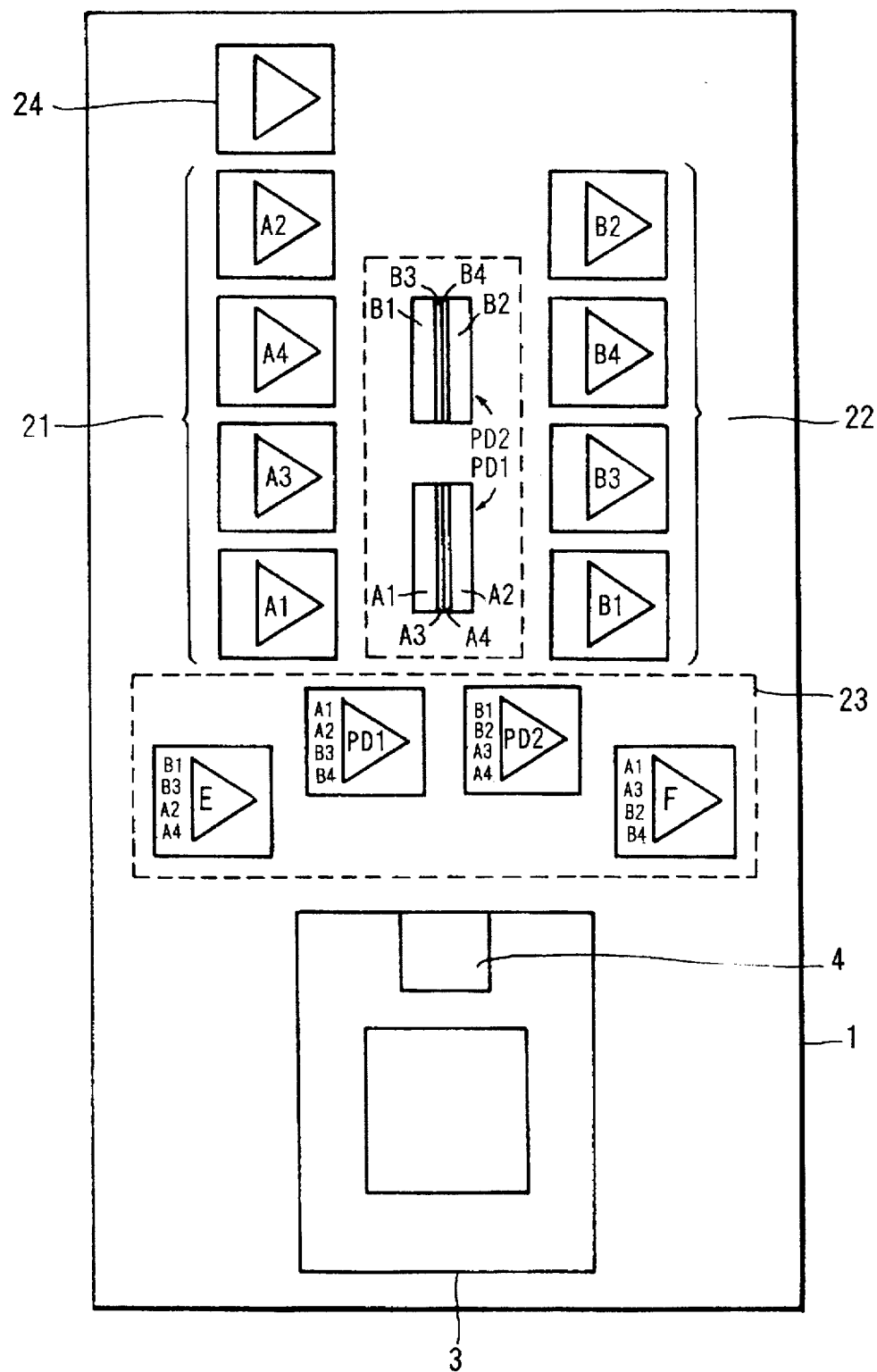
FIG. 10 is a block diagram of photodiode IC of the laser coupler according to the first embodiment of the invention.

FIG. 10 is a block diagram of the photodiode IC 1. As shown in FIG. 10, the photodiode IC 1 comprises an I-V converter amplifier circuit 21 for the photodiode PD1, I-V converter amplifier circuit 22 for the photodiode PD2, additive amplifier circuit 23 for arithmetic processing of output signals from the I-V converter amplifier circuits 21 and 22, and a biasing circuit 24. The I-V converter amplifier circuit 21 includes four I-V converter amplifiers for I-V-converting outputs from respective photodiodes A1 to A4 of the four-sectional photodiode PD1. Similarly, the I-V converter amplifier circuit 22 includes four I-V converter amplifiers for I-V-converting outputs from respective photodiodes B1 to B4 of the four-sectional photodiode PD2. The additive amplifier circuit 23 has four additive amplifiers for producing a first signal (PD1 signal), second signal (PD2 signal), third signal (E signal) and fourth signal (F signal), respectively.

Figure 11:
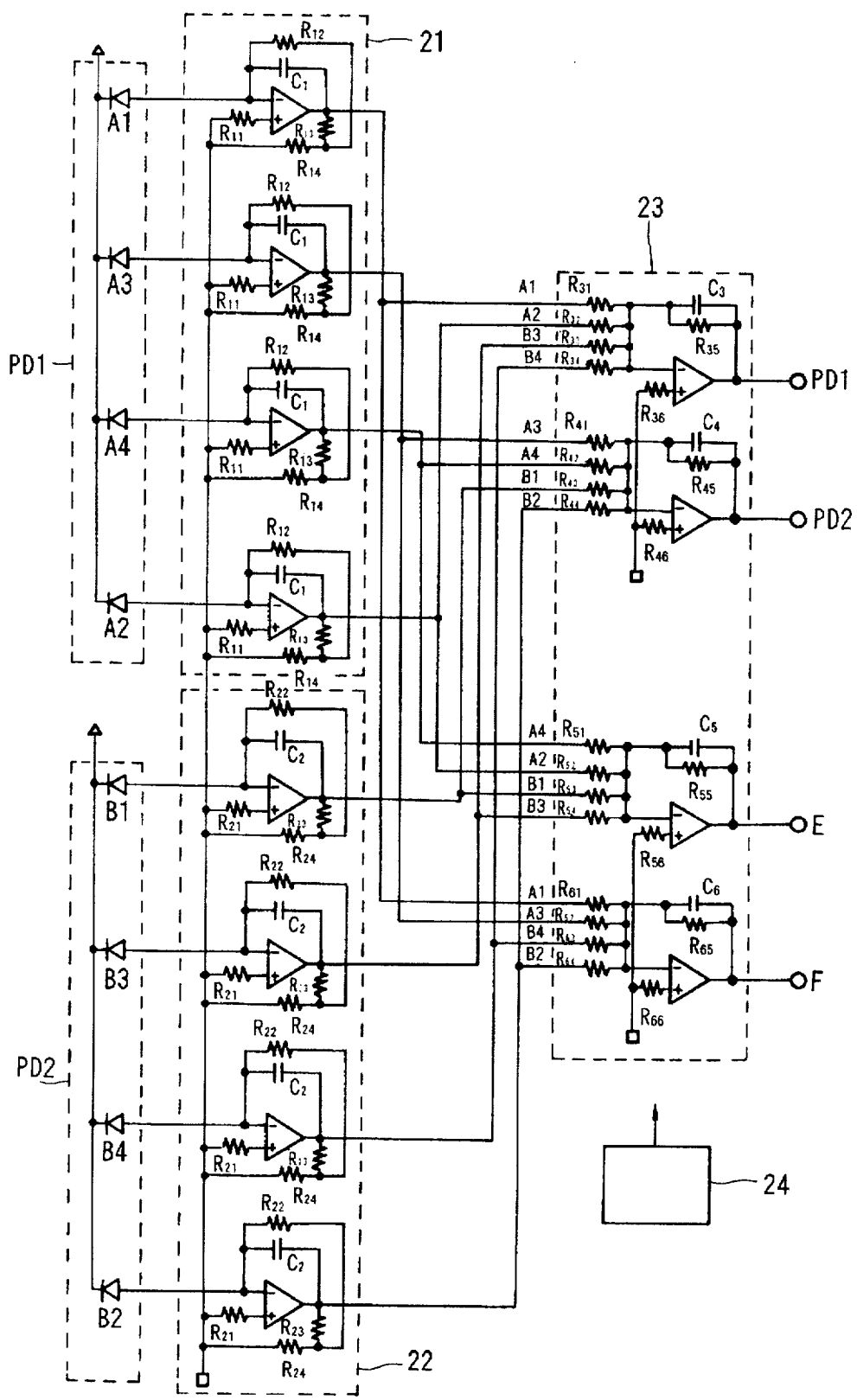
FIG. 11 is a circuit diagram showing a circuitry of I-V converter amplifier circuits and an additive amplifier circuit in the photodiode IC of the laser coupler according to the first embodiment of the invention.

As shown in FIG. 11, the I-V converter amplifiers of the I-V converter amplifier circuit 21 for the photodiode PD1 are coupled to output terminals of the photodiodes A1 to A4 of the photodiode PD1. Coupled to each of the I-V converter amplifiers are resistors $R_{11}$, $R_{12}$, $R_{13}$, $R_{14}$, and a capacitor $C_1$. The I-V converter amplifiers of the I-V converter amplifier circuit 22 for the photodiode PD2 are coupled to output terminals of the photodiodes B1 to B4 of the photodiode PD1. Coupled to each of the I-V converter amplifiers are resistors $R_{21}$, $R_{22}$, $R_{23}$, $R_{24}$, and a capacitor $C_2$.

In the additive amplifiers 23, $R_{31}$, $R_{32}$, $R_{33}$, $R_{34}$, $R_{35}$, $R_{36}$, $R_{41}$, $R_{42}$, $R_{43}$, $R_{44}$, $R_{45}$, $R_{46}$, $R_{51}$, $R_{52}$, $R_{53}$, $R_{54}$, $R_{55}$, $R_{56}$, $R_{61}$, $R_{62}$, $R_{63}$, $R_{64}$, $R_{65}$ and $R_{66}$ are resistors, and $C_3$, $C_4$, $C_5$ and $C_6$ are capacitors.

The gain of each I-V converter amplifier in the I-V converter amplifier circuit 21 for the photodiode PD1 can be adjusted by varying resistance values of the resistors $R_{11}$, $R_{12}$, $R_{13}$, and so forth. The gain of each I-V converter amplifier in the I-V converter amplifier circuit 22 for the photodiode PD2 can be adjusted by varying resistance values of the resistors $R_{21}$, $R_{22}$, $R_{23}$, and so forth. Therefore, by varying resistance values of the resistors $R_{11}$, $R_{12}$, $R_{13}$, etc. and/or resistance values of the resistors $R_{21}$, $R_{22}$, $R_{23}$, etc., the difference between the gain of each I-V converter amplifier in the I-V converter amplifier circuit 21 of the photodiode PD1 and the gain of each I-V converter amplifier in the I-V converter amplifier circuit 22 of the photodiode PD2 is determined to establish the relation (gain of each I-V converter amplifier in the I-V converter amplifier circuit 21 of the photodiode PD1):(gain of each I-V converter amplifier in the I-V converter amplifier circuit 22 of the photodiode PD2)=R:1. As a result, the relation (output signal from the photodiodes PD1):(output signal from the photodiode PD2)=1:1 can be established, and the difference between the amount of incident light to the photodiode PD1 and the amount of incident light to the photodiode PD2 can be corrected.

The ratio of the intensity of incident light to the photodiodes PD1 and PD2 relative to the intensity of incident light into the microprism 2 (the light using efficiency) is $$\eta = (P_F + P_R)/P_0$$
$$= 1 - R + R(1 - R)$$
$$= 1 - R^2$$

Therefore, when R=0.5, η=0.75. Any value of η around it is fully acceptable when the laser coupler according to the first embodiment is used as an optical pickup of a small CD player, for example.

As explained above, the first embodiment uses the half mirror 9 formed on the entire area of the bottom surface 2c of the microprism 2 to correct the difference between the amount of incident light to the photodiode PD1 and the amount of incident light to the photodiode PD2 in accordance with the difference between the gain of each I-V converter amplifier in the I-V converter amplifier circuit 21 of the photodiode PD1 and the gain of each I-V converter amplifier in the I-V converter amplifier circuit 22 of the photodiode PD2 to equivalently establish the relation (output signal from the photodiode PD1):(output signal from the photodiode PD2)=1:1. As compared with the conventional devices that use a half mirror selectively formed only on the photodiode PD1 of the photodiode IC 1 or a half mirror formed on a selective area of the bottom surface 2C of the microprism 2 corresponding to the photodiode PD1, the photodiode IC 1 and the microprism 2 according to the first embodiment of the invention can be made easily, and the manufacturing cost of the laser coupler can be reduced so much.

Next explained is a laser coupler taken as the second embodiment of the invention.

Figure 12:
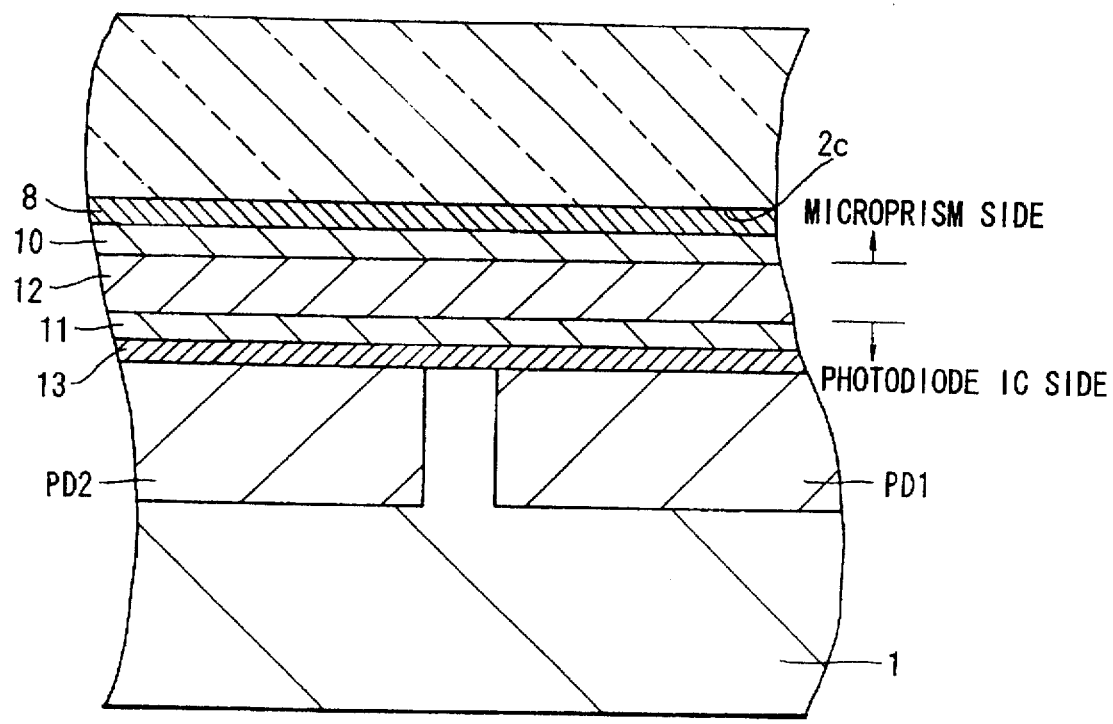
FIG. 12 is an enlarged, cross-sectional view showing a laser coupler according to the second embodiment of the invention.

Although the laser coupler according to the first embodiment uses the half mirror 9 in form of a dielectric multi-layered film formed on the entire area of the bottom surface 2C of the microprism 2, the laser coupler according to the second embodiment uses a half mirror formed on the entire surface of the photodiode IC 1. More specifically, as shown in FIG. 12, a SiN film 13 and a SiO$_2$ film 11 are formed on the entire surface of the photodiode IC 1, and these films 13 and 11 make up a half mirror. On the other hand, the microprism 2 has formed on the entire area of the bottom surface 2c an anti-reflection film 8 and a SiO$_2$ film 10. The SiO$_2$ film 10 on the bottom surface 2c of the microprism 2 is bonded to the SiO$_2$ film 11 on the photodiode IC 1 to mount the microprism 2 on the photodiode IC 1. In the other structural aspects, the laser coupler according to the second embodiment is the same as the laser coupler according to the first embodiment, and explanation in this respect is omitted here.

Also the second embodiment gives the same advantages as those of the first embodiment.

Next explained is a laser coupler taken as the third embodiment of the invention.

Figure 13:
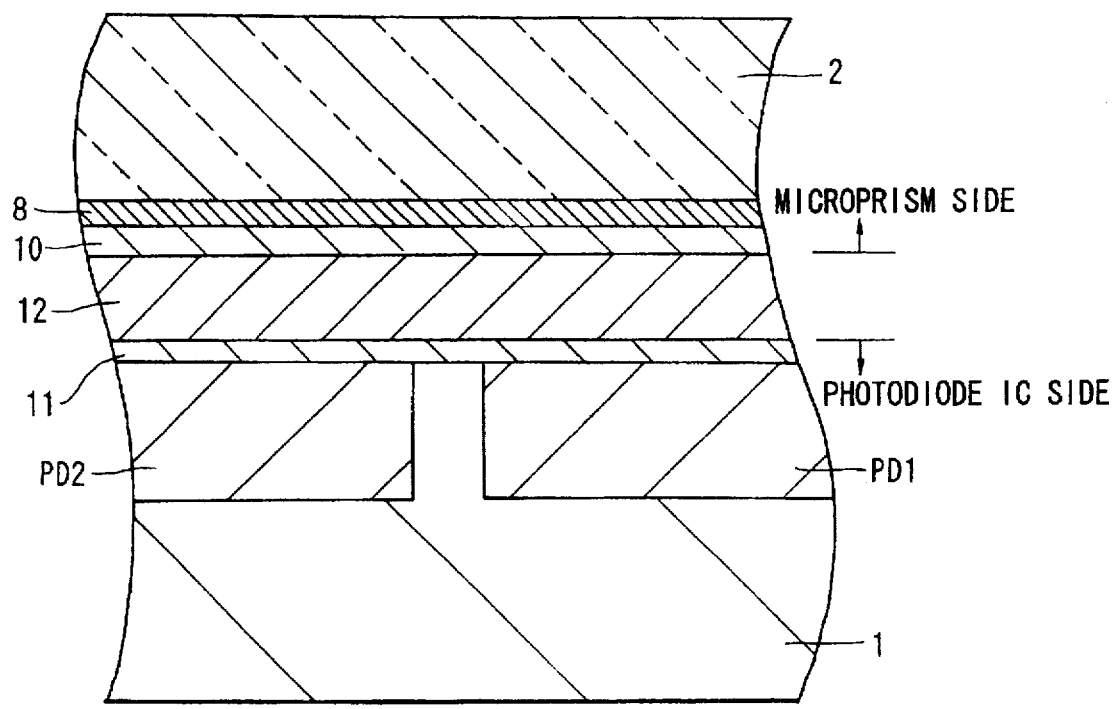
FIG. 13 is an enlarged, cross-sectional view showing a laser coupler according to the third embodiment of the invention.

Although the laser coupler according to the first embodiment uses the half mirror 9 in a form of a dielectric multi-layered film formed on the entire area of the bottom surface 2C of the microprism 2, and the laser coupler according to the second embodiment uses the half mirror made of the SiN film 13 and the SiO$_2$ film 11 formed on the entire surface of the photodiode IC 1, the laser coupler according to the third embodiment does not use either the half mirror 9 in form of a dielectric multi-layered film or the half mirror made of the SiN film 13 and the SiO$_2$ film 11. That is, in the laser coupler according to the third embodiment as shown in FIG. 13, only the SiO$_2$ film 11 is formed on the entire surface of the photodiode IC 1, and only the anti-reflection film 8 and the SiO$_2$ film 10 are formed on the entire area of the bottom surface 2c of the microprism 2.

In this structure, the interface (Si/SiO$_2$ interface) between the photodiode IC 1 made of Si and the upper-lying SiO$_2$ film 11 behave as a half mirror. That is, since the refractive index of Si forming the photodiode IC 1 is about 3.5 and the refractive index of the SiO$_2$ film 11 is about 1.45, the reflectance of the interface between the photodiode IC 1 and the upper-lying SiO$_2$ film 11 is $$|(3.5-1.45)/(3.5+1.45)|^2 \sim 0.17$$

This means that the interface between the photodiode IC 1 and the upper-lying SiO$_2$ film 11 can be used as a half mirror.

In the other structural aspects, the laser coupler according to the third embodiment is the same as the laser coupler according to the first embodiment, and explanation in this respect is omitted here.

According to the third embodiment which does not require either a SiN film 13 on the photodiode IC 1 or a half mirror 9 in form of a dielectric multi-layered film on the bottom surface 2c of the microprism 2, the structure of the laser coupler is more simple, and the process for fabricating the laser coupler is simplified. As a result, the manufacturing cost can be reduced much more.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, photodiodes PD1 and PD2 of a four-sectional type used in the first to third embodiments may be designed otherwise in accordance with the intended use of the laser coupler.

Although the first to third embodiments have been described as applying the invention to laser couplers, the invention may be used for various kinds of composite optical devices other than laser couplers.

The first to third embodiments use a pair of photodiodes PD1 and PD2 on a photodiode IC 1; however, the invention is applicable, more practically, to a device using three or more photodiodes formed on a photodiode IC 1.

As explained above, since the invention is configured to correct a difference between the amount of incident light to the first light detective device and the amount of incident light to the second light detective device by adjusting the difference between the gain of the first current-voltage converter amplifier and the gain of the second current-voltage converter amplifier, output signals from the first light detective device and output signals from the second light detective device can be equalized even by forming a half mirror on the entire area of the bottom surface of the prism or of the top surface of the support body in lieu of forming the half mirror only on a selective area of the bottom surface of the prism or of the top surface of the support body. The composite optical device permitting its half mirror to be made on the entire area of the bottom surface of the prism or on the entire surface of the support body can be fabricated more economically.

What is claimed is:

1. A composite optical device comprising:
   a support body having at least a first light detective device, a second light detective device, a first current-voltage converter amplifier coupled to an output terminal of the first light detective device, and a second current-voltage converter amplifier coupled to an output terminal of the second light detective device;
   a light emitting device formed on said support body; and a prism formed on said support body to lie over said first light detective device and said second light detective device, a beam of light entering into said prism through a predetermined incident surface being bifurcated and introduced onto said first light detective device and said second light detective device, and a difference between the amount of incident light introduced onto said first detective device and the amount of incident light introduced onto said second light detective device being corrected by adjusting a difference between the gain of said first current-voltage converter amplifier and the gain of said second current-voltage converter amplifier.

2. The composite optical device according to claim 1, wherein the difference between the gain of said first current-voltage converter amplifier and the gain of said second current-voltage converter amplifier is determined by adjusting the value of resistance in said first current-voltage converter amplifier and/or the value of resistance in said second current-voltage converter amplifier.

3. The composite optical device according to claim 1, wherein a half mirror is formed on the entire area of a bottom surface of said prism.

4. The composite optical device according to claim 1, wherein a half mirror is formed on the entire surface of said support body.

5. The composite optical device according to claim 1, wherein a passivation film formed on the entire surface of said support body, and the interface between said passivation and said support body make up a half mirror.

6. The composite optical device according to claim 1, wherein said support body is a semiconductor substrate.

7. The composite optical device according to claim 6, wherein said support body is a silicon substrate.

8. The composite optical device according to claim 3, wherein said half mirror is made of a dielectric multi-layered film.

9. The composite optical device according to claim 4, wherein said half mirror is made of a silicon nitride film formed on said support body and a silicon dioxide film formed on said silicon nitride film.

10. The composite optical device according to claim 5, wherein said passivation film is a silicon dioxide film.

11. The composite optical device according to claim 1, wherein said first light detective device and said second light detective device are of a multi-sectional type.

12. The composite optical device according to claim 1, wherein said first light detective device and said second light detective device is of a four-sectional type.

* * * * *